(12) United States Patent
Zhang et al.

(10) Patent No.: US 11,513,164 B2
(45) Date of Patent: Nov. 29, 2022

(54) METHOD AND SYSTEM FOR ESTIMATING BATTERY PACK BALANCE STATE OF NEW ENERGY VEHICLE

(71) Applicant: Guangzhou Automobile Group Co., Ltd., Guangdong (CN)

(72) Inventors: Yizhen Zhang, Sunnyvale, CA (US); Jin Shang, Sunnyvale, CA (US); Xiong Zhang, Guangdong (CN); Yonggang Xu, Sunnyvale, CA (US)

(73) Assignee: GUANGZHOU AUTOMOBILE GROUP CO., LTD., Guangzhou (CN)

( * ) Notice: Subject to any disclaimer, the term of this patent is extended or adjusted under 35 U.S.C. 154(b) by 266 days.

(21) Appl. No.: 17/082,051

(22) Filed: Oct. 28, 2020

(65) Prior Publication Data

US 2022/0128631 A1    Apr. 28, 2022

(51) Int. Cl.
| | |
|---|---|
| *G01R 31/396* | (2019.01) |
| *G01R 31/3835* | (2019.01) |
| *G01R 31/36* | (2020.01) |
| *B60L 58/12* | (2019.01) |
| *H02J 7/00* | (2006.01) |

(52) U.S. Cl.
CPC ............ *G01R 31/396* (2019.01); *B60L 58/12* (2019.02); *G01R 31/3648* (2013.01); *G01R 31/3835* (2019.01); *H02J 7/0048* (2020.01); *B60L 2240/12* (2013.01); *B60L 2240/545* (2013.01); *B60L 2240/547* (2013.01); *B60L 2260/44* (2013.01); *B60L 2260/46* (2013.01)

(58) Field of Classification Search
CPC .............. G01R 31/396; G01R 31/3648; G01R 31/3835; B60L 58/12; B60L 2240/12; B60L 2240/545; B60L 2240/547; B60L 2260/44; B60L 2260/46; B60L 58/22; H02J 7/0048; H02J 7/0013; Y02T 10/70
See application file for complete search history.

(56) References Cited

U.S. PATENT DOCUMENTS

| | | | | |
|---|---|---|---|---|
| 8,552,693 | B2 * | 10/2013 | Paryani | H02J 7/007194 |
| | | | | 320/152 |
| 9,091,738 | B2 * | 7/2015 | Gibbs | G01R 31/396 |
| 9,770,997 | B2 * | 9/2017 | Lin | H02J 7/0014 |

(Continued)

FOREIGN PATENT DOCUMENTS

KR    101967863 B1    4/2019

*Primary Examiner* — Tung S Lau
(74) *Attorney, Agent, or Firm* — ScienBiziP, P.C.

(57) ABSTRACT

A method and system for estimating a battery pack balance state of a new energy vehicle are provided. The method includes: acquiring an actual cell voltage difference measured for a battery pack of a new energy vehicle, and acquiring one or more operation condition parameters for an operation condition under which the actual cell voltage difference is measured, wherein the actual cell voltage difference is the difference between the maximum and minimum battery cell voltages within the battery pack; determining an expected cell voltage difference according to a model based on the one or more operation condition parameters; determining a compensated cell voltage difference according to the actual cell voltage difference and the expected cell voltage difference; and estimating a battery pack balance state of the new energy vehicle according to the compensated cell voltage difference.

20 Claims, 3 Drawing Sheets

(56) References Cited

U.S. PATENT DOCUMENTS

| | | | |
|---|---|---|---|
| 11,437,827 B2* | 9/2022 | Eriksson Normand | ...................... H02J 7/0016 |
| 2009/0027006 A1* | 1/2009 | Vezzini | ................. H02J 7/0014 320/118 |
| 2014/0266221 A1* | 9/2014 | Baughman | ......... G01R 31/3835 324/426 |
| 2014/0361743 A1* | 12/2014 | Lin | ........................ B60L 58/15 320/109 |
| 2017/0214256 A1* | 7/2017 | Hardy | ............... H02J 7/007182 |
| 2019/0089167 A1* | 3/2019 | Normand | ................. B60L 58/20 |
| 2021/0184473 A1* | 6/2021 | Geng | ................ H02J 7/007194 |

* cited by examiner

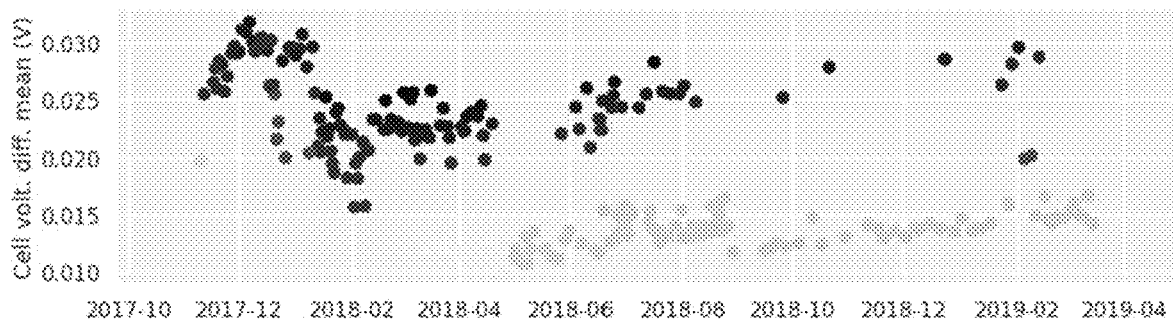

Fig. 1(a)

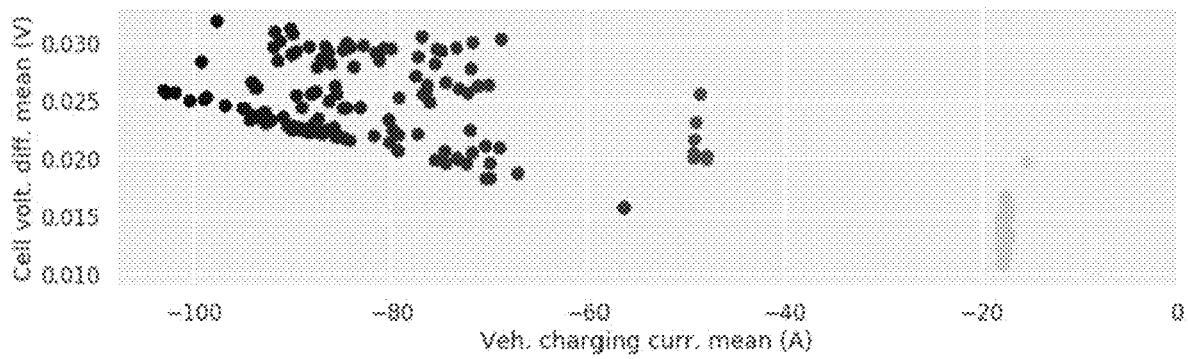

Fig. 1(b)

```
┌─────────────────────────────────────────────────────────┐
│ Acquire an actual cell voltage difference measured for  │
│ a battery pack of a new energy vehicle, and acquire one │
│ or more operation condition parameters for an operation │──── S202
│ condition under which the actual cell voltage          │
│ difference is measured                                  │
└─────────────────────────────────────────────────────────┘
                            │
                            ▼
┌─────────────────────────────────────────────────────────┐
│ Determine an expected cell voltage difference according │──── S204
│ to the one or more operation condition parameters       │
└─────────────────────────────────────────────────────────┘
                            │
                            ▼
┌─────────────────────────────────────────────────────────┐
│ Determine a compensated cell voltage difference         │
│ according to the actual cell voltage difference and the │──── S206
│ expected cell voltage difference                        │
└─────────────────────────────────────────────────────────┘
                            │
                            ▼
┌─────────────────────────────────────────────────────────┐
│ Estimate a battery pack balance state of the new energy │──── S208
│ vehicle according to the compensated cell voltage       │
│ difference                                              │
└─────────────────────────────────────────────────────────┘
```

Fig. 2

METHOD AND SYSTEM FOR ESTIMATING BATTERY PACK BALANCE STATE OF NEW ENERGY VEHICLE

TECHNICAL FIELD

The present disclosure relates to the field of battery safety, in particular to a method and system for estimating a battery pack balance state of a new energy vehicle.

BACKGROUND

New Energy Vehicles (NEVs) include, among others, Electric Vehicles (EVs), Hybrid Electric Vehicles (HEVs), Plug-in Hybrid Electric Vehicles (PHEVs), etc. NEVs may transmit real-time vehicular data to internet cloud servers for remote monitoring and data collecting. As a result, significant amount of data for NEV models has accumulated over time. Hidden in the data are valuable clues regarding the performance and health of the NEV, especially the battery pack, which is a key component of the NEVs.

An effective data-driven battery pack health monitoring method needs to be established, and the balance state between battery pack cells is of great importance for the health of the battery pack.

SUMMARY

The following presents a simplified summary in order to provide a basic understanding of some aspects of the present disclosure. This summary is not an extensive overview of the present disclosure. It is not intended to identify key or critical element of the present disclosure. The following summary merely presents some concepts of the present disclosure in a simplified form as a prelude to the description below.

In accordance with an aspect of the present disclosure, a method for estimating a battery pack balance state of a new energy vehicle is provided. The method includes: acquiring an actual cell voltage difference measured for a battery pack of a new energy vehicle, and acquiring one or more operation condition parameters for an operation condition under which the actual cell voltage difference is measured, wherein the actual cell voltage difference is the difference between the maximum and minimum battery cell voltages within the battery pack; determining an expected cell voltage difference according to the one or more operation condition parameters; determining a compensated cell voltage difference according to the actual cell voltage difference and the expected cell voltage difference; and estimating a battery pack balance state of the new energy vehicle according to the compensated cell voltage difference.

In at least one exemplary embodiment of the present disclosure, the one or more operation condition parameters for the operation condition include at least one of: a vehicle current, a state-of-charge, a battery temperature, a vehicle speed, or an odometer value.

In at least one exemplary embodiment of the present disclosure, determining the expected cell voltage difference according to the one or more operation condition parameters includes: determining, by using a machine learning model, the expected cell voltage difference according to the one or more operation condition parameters.

In at least one exemplary embodiment of the present disclosure, the machine learning model is a linear model, and determining, by using the machine learning model, the expected cell voltage difference according to the one or more operation condition parameters includes: determining the expected cell voltage difference $\delta_{ref}$ based on the following formula: $\delta_{ref} = w_0 + w_1 * P_1 + \ldots + w_M * P_M$, where $w_0, w_1, \ldots, w_M$ are weights of the linear model, $P_1, \ldots, P_M$ are the one or more operation condition parameters, and $M$ is the number of the one or more operation condition parameters.

In at least one exemplary embodiment of the present disclosure, the weights $w_0, w_1, \ldots, w_M$ of the linear model are obtained through training based on first training data, wherein the first training data includes one or more operation condition parameters for multiple different operation conditions, and actual cell voltage differences measured for battery packs of multiple new energy vehicles under the multiple different operation conditions.

In at least one exemplary embodiment of the present disclosure, before the weights $w_0, w_1, \ldots, w_M$ of the linear model are obtained through training based on the first training data, actual cell voltage differences measured for battery packs of new energy vehicles satisfying a preset condition are removed from the first training data, wherein the preset condition includes: new energy vehicles with abnormal fleet performance, new energy vehicles with fleet performance at top or bottom percentiles among the multiple new energy vehicles.

In at least one exemplary embodiment of the present disclosure, the machine learning model is a nonlinear model, and determining, by using the machine learning model, the expected cell voltage difference $\delta_{ref}$ according to the one or more operation condition parameters includes: determining, based on the nonlinear model by using the one or more operation condition parameters as an input, the expected cell voltage difference $\delta_{ref}$, wherein the nonlinear model includes a neural network-based model or a random forest-based model.

In at least one exemplary embodiment of the present disclosure, weights in the nonlinear model are obtained through training based on first training data, wherein the first training data includes one or more operation condition parameters for multiple different operation conditions, and actual cell voltage differences measured for battery packs of multiple new energy vehicles under the multiple different operation conditions.

In at least one exemplary embodiment of the present disclosure, before the weights of the nonlinear model are obtained through training based on the first training data, actual cell voltage differences measured for battery packs of new energy vehicles satisfying a preset condition are removed from the first training data, wherein the preset condition includes: new energy vehicles with abnormal fleet performance, new energy vehicles with fleet performance at top or bottom percentiles among the multiple new energy vehicles.

In at least one exemplary embodiment of the present disclosure, determining the compensated cell voltage difference according to the actual cell voltage difference and the expected cell voltage difference includes: determining the compensated cell voltage difference $\Delta$ based on the following formula: $\Delta = \delta_{act} - \delta_{ref}$, where $\delta_{act}$ is the actual cell voltage difference, and $\delta_{ref}$ is the expected cell voltage difference.

In at least one exemplary embodiment of the present disclosure, the actual cell voltage difference measured for the battery pack of the new energy vehicle includes measured actual cell voltage difference for each time record; and determining the compensated cell voltage difference according to the actual cell voltage difference and the expected cell voltage difference includes: determining the compensated cell voltage difference for each time record, and aggregating the compensated cell voltage difference for each time record within a preset time unit to obtain mean compensated cell voltage difference; or, determining the compensated cell voltage difference for each time record, and aggregating the compensated cell voltage difference for each time record by trip-on-battery period basis to obtain mean compensated cell voltage difference; or, determining the compensated cell voltage difference for each time record, and aggregating the compensated cell voltage difference for each time record by charging period basis to obtain mean compensated cell voltage difference.

In at least one exemplary embodiment of the present disclosure, estimating the battery pack balance state of the new energy vehicle according to the compensated cell voltage difference includes: in a case where the mean compensated cell voltage difference is above a first threshold or mean compensated cell voltage differences in multiple preset time units or multiple trip-on-battery periods or multiple charging periods show a degradation trend, determining that the battery pack of the new energy vehicle is in an unbalanced state.

In at least one exemplary embodiment of the present disclosure, before estimating the battery pack balance state of the new energy vehicle according to the compensated cell voltage difference, the method further includes: determining normalized weighted compensated cell voltage difference within a preset period; and estimating the battery pack balance state of the new energy vehicle according to the compensated cell voltage difference includes: estimating the battery pack balance state of the new energy vehicle according to the normalized weighted compensated cell voltage difference within the preset period.

In at least one exemplary embodiment of the present disclosure, determining the normalized weighted compensated cell voltage difference within a preset period includes: determining normalized weighted compensated cell voltage difference based on the following formula:

$$\Delta_{norm} = \frac{\sum_{n=1}^{N}(\omega_n \Delta_n)}{\sum_{n=1}^{N}\omega_n},$$

where $\Delta_1, \Delta_2, \ldots, \Delta_N$ are respective instances of compensated cell voltage difference within the preset period, $\omega_1, \omega_2, \ldots, \omega_N$ are weights for the respective instances of compensated cell voltage difference within the preset period, and N is the number of the instances of compensated cell voltage difference within the preset period.

In at least one exemplary embodiment of the present disclosure, among the weights $\omega_1, \omega_2, \ldots, \omega_N$ for the respective instances of compensated cell voltage difference within the preset period, a weight for the latest instance of compensated cell voltage difference is equal to a preset value, and weights for earlier instances of compensated cell voltage difference within the preset period decay exponentially.

In at least one exemplary embodiment of the present disclosure, the weights $\omega_1, \omega_2, \ldots, \omega_N$ for the respective instances of compensated cell voltage difference within the preset period are obtained through training based on second training data, wherein the second training data includes actual vehicle records with abnormal battery pack cell imbalance.

In at least one exemplary embodiment of the present disclosure, estimating the battery pack balance state of the new energy vehicle according to the normalized weighted compensated cell voltage difference within the preset period includes: in a case where the normalized weighted compensated cell voltage difference is above a second threshold or normalized weighted compensated cell voltage differences in multiple preset periods show a degradation trend, determining that the battery pack of the new energy vehicle is in an unbalanced state.

In at least one exemplary embodiment of the present disclosure, the method further includes: sending a maintenance required warning when a result of estimating the battery pack balance state of the new energy vehicle according to the compensated cell voltage difference indicates that the battery pack of the new energy vehicle is in an unbalanced state.

In accordance with another aspect of the present disclosure, a system for estimating a battery pack balance state of a new energy vehicle is provided. The system may be located in a server or an on-board computing device. The system includes a memory and a processor, wherein a computer program is stored in the memory, and the processor is configured to execute the computer program to perform the method as described in any one or more of the above embodiments.

In accordance with another aspect of the present disclosure, a non-transitory computer readable storage medium is provided. The non-transitory computer readable storage medium stores a computer program, wherein the computer program, when being executed by a processor, causes the processor to perform the method as described in any one or more of the above embodiments.

BRIEF DESCRIPTION OF THE DRAWINGS

The accompanying drawings described here are used for providing a deeper understanding of the present disclosure, and constitute a part of the application; schematic embodiments of the present disclosure and description thereof are used for illustrating the present disclosure and not intended to form an improper limit to the present disclosure. In the accompanying drawings:

FIG. 1(a) is a schematic diagram of time series of mean cell voltage difference for each charge for one EV;

FIG. 1(b) is a schematic diagram showing mean cell voltage difference vs. mean charging current for the same EV;

FIG. 2 shows a flow chart of a method for estimating a battery pack balance state of a new energy vehicle according to an embodiment of the present disclosure;

DETAILED DESCRIPTION OF THE EMBODIMENTS

Figure 3:
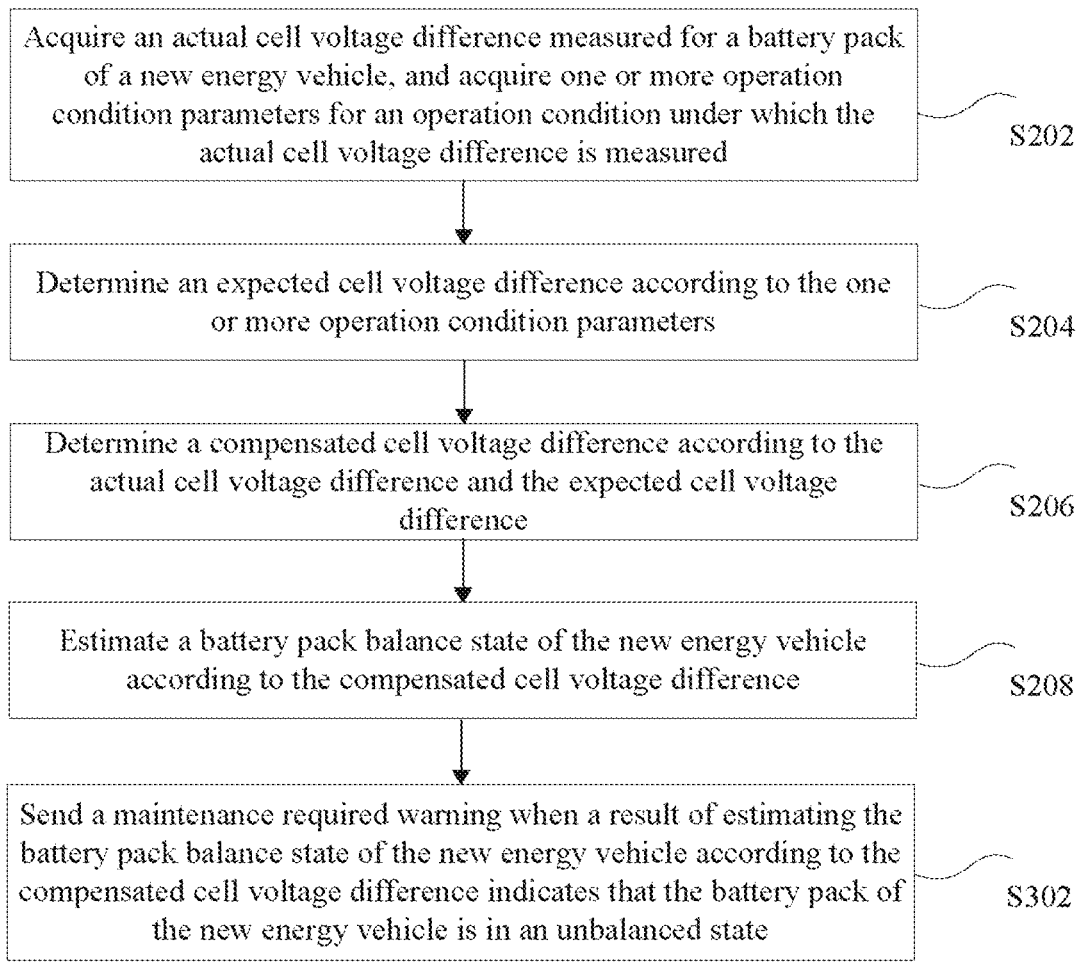
FIG. 3 shows a flow chart of a method for estimating a battery pack balance state of a new energy vehicle according to an exemplary embodiment of the present disclosure.

Based on historical data analysis of time series of individual battery cell voltages of one type of EVs that had several reported battery pack failures, the difference between the maximum and minimum battery cell voltages δ within the battery pack is identified as an important indicator of the battery pack health conditions. For the battery pack to operate normally, it is necessary to keep the battery cell voltage difference in a very small range most of the time. Abnormal battery pack degradation was observed on some vehicles when the cell voltage difference increased steadily, and battery capacity could have dropped unusually at the same time. It turned out that the abnormal battery pack degradation trend could indicate serious issues and should be corrected with immediate actions.

However, it is also observed that the battery cell voltage difference δ is a variable depending on certain operating conditions, e.g., current, state-of-charge, temperature, vehicle speed, odometer value, etc. For example, FIG. 1(a) is a schematic diagram of time series of mean cell voltage difference for each charge for one EV, and FIG. 1(b) is a schematic diagram showing mean cell voltage difference vs. mean charging current for the same EV history. In FIGS. 1(a) and 1(b), darker dots correspond to higher mean charging current (fast charge), and lighter dots correspond to lower mean charging current (slow charge). As shown in FIGS. 1(a) and 1(b), the mean cell voltage difference during fast charging is much higher than that during slow charging for one type of EV studied. As a result, the mean cell voltage difference could jump up and down when the user switched between fast and slow charging modes for different charging periods, as shown in FIG. 1(a). In this case it is difficult to identify any slow degradation trend for the real battery cell imbalance state, since the variation caused by different levels of charging modes can be much bigger than the small degradation trend observed for same level of charging mode. The battery cell voltage difference δ may also vary with other operating condition parameters, e.g., state-of-charge, temperature, vehicle speed, odometer value, etc.

Therefore, a model needs to be established to describe the expected normal range of cell voltage difference under different operating conditions, and abnormal cases need to be identified for different operating conditions. In view of this, the embodiments of the present disclosure proposes a solution that can monitor and analyze battery pack balance conditions for all actively running NEVs, detect any abnormal battery pack degradation trend, and provide early warnings to OEMs, dealerships, and end customers. Furthermore, troubleshooting and predictive maintenance work can be performed at dealerships as soon as required to extend battery life span and reduce warranty costs.

In order to make those skilled in the art understand the solutions of the present disclosure more clearly, the technical solutions in the embodiments of the present disclosure are clearly and completely elaborated below in combination with the accompanying drawings. It is apparent that the described embodiments are only a part of the embodiments of the present disclosure but not all. Based on the embodiments of the present disclosure, all the other embodiments obtained by those of ordinary skill in the art on the premise of not contributing creative effort belong to the scope of protection of the present disclosure.

It is to be noted that the terms like "first" and "second" in the specification, the claims and the accompanying drawings of the present disclosure are used for differentiating the similar objects, but do not have to describe a specific order or a sequence. It should be understood that the objects may be exchanged under appropriate circumstances, so that the embodiments of the present disclosure described here may be implemented in an order different from that described or shown here. Moreover, the terms like "include" and "have" and any variation of them are intended to cover nonexclusive including; for example, the process, method, system, product or device including a series of steps or units do not have to be limited to those clearly listed steps or units, but may include other steps or units which are not clearly listed or inherent in these process, method, system, product or device.

In accordance with an embodiment of the present disclosure, a method for estimating a battery pack balance state of a new energy vehicle is provided. The method may be executed by a server (e.g., a cloud-based server) or an on-board computing device, or any device possessing a computing capability. FIG. 2 shows a flow chart of a method for estimating a battery pack balance state of a new energy vehicle according to an embodiment of the present disclosure. As shown in FIG. 2, the method for estimating the battery pack balance state of the new energy vehicle includes the following operations S202 and S208.

In operation S202, an actual cell voltage difference measured for a battery pack of a new energy vehicle is acquired, and one or more operation condition parameters for an operation condition under which the actual cell voltage difference is measured are acquired, wherein the actual cell voltage difference is the difference between the maximum and minimum battery cell voltages within the battery pack.

In at least one exemplary embodiment of the present disclosure, the one or more operation condition parameters for the operation condition may include one or more operation condition parameters that affect the value of the measured actual cell voltage difference. In other words, the measured actual cell voltage difference is a variable depending on the one or more operation condition parameters corresponding to the operation condition under which the actual cell voltage difference is measured. For example, the one or more operation condition parameters for the operation condition may include at least one of: a vehicle current, a state-of-charge, a battery temperature, a vehicle speed, or an odometer value. When using these operation condition parameters to determine the expected cell voltage difference, low order or higher order form of these operation condition parameters may be used.

In practical situations, the acquisition of the actual cell voltage difference and the acquisition of the one or more operation condition parameters are operations independent from each other, and there is no specific limitation on the executing sequence between the two acquisition actions. When the method is executed by a server or a device located in the exterior of the vehicle, the server or the device located in the exterior of the vehicle may acquire the measured actual cell voltage difference and the one or more operation condition parameters from the vehicle based on either an active reporting manner or a request-response manner. When the method is executed by an on-board computing device, the on-board computing device may acquire the measured actual cell voltage difference and the one or more operation condition parameters from the data record stored in the local memory after the measurement and the data collection have been conducted.

In operation S204, an expected cell voltage difference is determined according to the one or more operation condition parameters.

In at least one exemplary embodiment of the present disclosure, the operation S204 may be implemented in the following manner:

the expected cell voltage difference is determined according to the one or more operation condition parameters by using a machine learning model.

There are various forms of the machine learning models that are able to accurately estimate the expected cell voltage difference according to the one or more operation condition parameters. For example, the following forms of machine learning models can be adopted.

(1) In at least one exemplary embodiment of the present disclosure, the machine learning model may be a linear model.

The operation S204 may include: the expected cell voltage difference $\delta_{ref}$ is determined based on the following formula: $\delta_{ref} = w_0 + w_1 * P_1 + \ldots + w_M * P_M$, where $w_0, w_1, \ldots, w_M$ are weights of the linear model, $P_1, \ldots, P_M$ are the one or more operation condition parameters, and M is the number of the one or more operation condition parameters.

In at least one exemplary embodiment of the present disclosure, the weights $w_0, w_1, \ldots, w_M$ of the linear model are obtained through training based on first training data, wherein the first training data includes one or more operation condition parameters for multiple different operation conditions, and actual cell voltage differences measured for battery packs of multiple new energy vehicles under the multiple different operation conditions.

In at least one exemplary embodiment of the present disclosure, before the weights $w_0, w_1, \ldots, w_M$ of the linear model are obtained through training based on the first training data, actual cell voltage differences measured for battery packs of new energy vehicles satisfying a preset condition are removed from the first training data, wherein the preset condition includes: new energy vehicles with abnormal fleet performance, new energy vehicles with fleet performance at top or bottom percentiles among the multiple new energy vehicles. That is, actual cell voltage differences measured for battery packs of abnormal or obviously abnormal new energy vehicles can be removed from the first training data, so as to ensure the accuracy of the training model.

(2) In at least one exemplary embodiment of the present disclosure, the machine learning model may be a nonlinear model. For example, the nonlinear model may include a neural network-based model or a random forest-based model. Those skilled in the art should understand that other types of nonlinear models may also be applied in this solution. The neural network-based model may have a network structure comprising an input layer, one or more hidden layers, and an output layer.

The operation S204 may include: the expected cell voltage difference $\delta_{ref}$ is determined based on the nonlinear model by using the one or more operation condition parameters as an input.

In at least one exemplary embodiment of the present disclosure, weights in the nonlinear model are obtained through training based on first training data, wherein the first training data includes one or more operation condition parameters for multiple different operation conditions, and actual cell voltage differences measured for battery packs of multiple new energy vehicles under the multiple different operation conditions.

In at least one exemplary embodiment of the present disclosure, before the weights of the nonlinear model are obtained through training based on the first training data, actual cell voltage differences measured for battery packs of new energy vehicles satisfying a preset condition are removed from the first training data, wherein the preset condition includes: new energy vehicles with abnormal fleet performance, new energy vehicles with fleet performance at top or bottom percentiles among the multiple new energy vehicles. That is, actual cell voltage differences measured for battery packs of abnormal or obviously abnormal new energy vehicles can be removed from the first training data, so as to ensure the accuracy of the training model.

In operation S206, a compensated cell voltage difference is determined according to the actual cell voltage difference and the expected cell voltage difference.

In at least one exemplary embodiment of the present disclosure, the operation S206 may include: the compensated cell voltage difference $\Delta$ is determined based on the following formula: $\Delta = \delta_{act} - \delta_{ref}$, where $\delta_{act}$ is the actual cell voltage difference, and $\delta_{ref}$ is the expected cell voltage difference.

In practical applications, the compensated cell voltage difference $\Delta$ can be calculated for each time record and aggregated daily (or every 12 hours, or every week, or every month, etc., the time unit for aggregation can be any preset time unit, the length of which can be specified according to practical requirements), or by each trip-on-battery/charging period basis. In at least one exemplary embodiment of the present disclosure, the actual cell voltage difference measured for the battery pack of the new energy vehicle includes measured actual cell voltage difference for each time record (the measurement may be conducted at preset time intervals, or according to the occurrence of certain events, or according to a combination of both). The operation S206 may include one of the follows:

(1) the compensated cell voltage difference for each time record is determined, and the compensated cell voltage difference for each time record within a preset time unit is aggregated to obtain mean compensated cell voltage difference (for each preset time unit).

(2) the compensated cell voltage difference for each time record is determined, and the compensated cell voltage difference for each time record is aggregated by trip-on-battery period basis to obtain mean compensated cell voltage difference (for each trip-on-battery period).

(3) the compensated cell voltage difference for each time record is determined, and the compensated cell voltage difference for each time record is aggregated by charging period basis to obtain mean compensated cell voltage difference (for each charging period).

In operation S208, a battery pack balance state of the new energy vehicle is estimated according to the compensated cell voltage difference.

Based on the above mentioned mean compensated cell voltage difference (for each preset time unit, or for each trip-on-battery period, or for each charging period), the battery pack balance state of the new energy vehicle can be estimated in real time. In at least one exemplary embodiment of the present disclosure, the operation S208 may include: in a case where the mean compensated cell voltage difference is above a first threshold or mean compensated cell voltage differences in multiple preset time units or multiple trip-on-battery periods or multiple charging periods show a degradation trend, the battery pack of the new energy vehicle is determined to be in an unbalanced state.

When it is required to evaluate the balance state and the degradation trend in the battery pack based on the data record of a preset period of time, a normalized weighted compensated cell voltage difference within a preset period can be determined based on the compensated cell voltage difference data within the preset period, so that the battery pack balance state of the new energy vehicle can be estimated based on the normalized weighted compensated cell voltage difference. In at least one exemplary embodiment of the present disclosure, before the operation S208, the method may further include: normalized weighted compensated cell voltage difference within a preset period is determined. The operation S208 may include: the battery pack balance state of the new energy vehicle is estimated according to the normalized weighted compensated cell voltage difference within the preset period.

In at least one exemplary embodiment of the present disclosure, the operation of determining the normalized weighted compensated cell voltage difference within a preset period may include: normalized weighted compensated cell voltage difference is determined based on the following formula:

$$\Delta_{norm} = \frac{\sum_{n=1}^{N}(\omega_n \Delta_n)}{\sum_{n=1}^{N}\omega_n},$$

where $\Delta_1, \Delta_2, \ldots, \Delta_N$ are respective instances of compensated cell voltage difference within the preset period, $\omega_1, \omega_2, \ldots, \omega_N$ are weights for the respective instances of compensated cell voltage difference within the preset period, and N is the number of the instances of compensated cell voltage difference within the preset period.

In at least one exemplary embodiment of the present disclosure, among the weights $\omega_1, \omega_2, \ldots, \omega_N$ for the respective instances of compensated cell voltage difference within the preset period, a weight for the latest instance of compensated cell voltage difference may be equal to a preset value (e.g., the weight for the latest instance of compensated cell voltage difference may be equal to 1), and weights for earlier instances of compensated cell voltage difference within the preset period decay exponentially. In this way, the latest instance of compensated cell voltage difference has the largest impact on the normalized weighted compensated cell voltage difference, while earlier instances of compensated cell voltage difference have smaller impact on the normalized weighted compensated cell voltage difference.

In at least one exemplary embodiment of the present disclosure, the weights $\omega_1, \omega_2, \ldots, \omega_N$ for the respective instances of compensated cell voltage difference within the preset period may be obtained through training based on second training data, wherein the second training data includes actual vehicle records with abnormal battery pack cell imbalance.

Based on the above mentioned normalized weighted compensated cell voltage difference, the battery pack balance state of the new energy vehicle can be estimated in real time. In at least one exemplary embodiment of the present disclosure, the operation S208 may include: in a case where the normalized weighted compensated cell voltage difference is above a second threshold or normalized weighted compensated cell voltage differences in multiple preset periods show a degradation trend, determining that the battery pack of the new energy vehicle is in an unbalanced state.

When the compensated cell voltage difference (mean or normalized weighted compensated cell voltage difference) shows that the battery pack is in an unbalanced state or has a degradation trend in the battery pack balance conditions, automatic predictive maintenance notices can be generated for battery packs of different kinds of NEVs (e.g. EV, HEV, PHEV, etc.). FIG. 3 shows a flow chart of a method for estimating a battery pack balance state of a new energy vehicle according to an exemplary embodiment of the present disclosure. As shown in FIG. 3, in at least one exemplary embodiment of the present disclosure, the method may further include an operation S302.

In operation S302, a maintenance required warning is sent when a result of estimating the battery pack balance state of the new energy vehicle according to the compensated cell voltage difference indicates that the battery pack of the new energy vehicle is in an unbalanced state.

The method described in the embodiments can be applied to analyze relevant data stored in the cloud server and estimate the current battery pack balance state effectively. Degradation trend in the battery pack balance conditions can be detected, so that automatic predictive maintenance notices can be generated for battery packs of different kinds of NEVs (e.g. EV, HEV, PHEV, etc.). The battery life span can be extended to create better customer experience, and warranty costs can be greatly reduced if troubleshooting and predictive maintenance actions are performed shortly after early warning notices are issued. High level of predictive maintenance and customer satisfaction can be achieved with the proposed method, instead of reactive maintenance which results in poor customer experiences and higher warranty expenses for OEMs.

It is to be noted that for the sake of simple description, each aforementioned embodiment of the method is described as a series of action combinations. But those skilled in the art should know that the present disclosure is not limited to a sequence of the described actions, it is because some steps may be performed in other sequences or simultaneously according to the present disclosure. Besides, those skilled in the art should also know that all the embodiments described in the specification are preferred embodiments, and the actions and modules involved may not be necessary.

Figure 4:
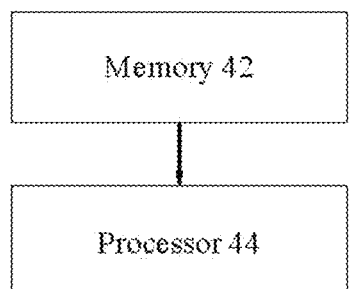
FIG. 4 shows a schematic diagram of a system for estimating a battery pack balance state of a new energy vehicle according to an embodiment of the present disclosure.

In accordance with another aspect of the present disclosure, a system for estimating a battery pack balance state of a new energy vehicle is provided. The system may be located in a server or an on-board computing device, or any device having a computing capability. FIG. 4 shows a schematic diagram of a system for estimating a battery pack balance state of a new energy vehicle according to an embodiment of the present disclosure. As shown in FIG. 4, the system includes a memory 42 and a processor 44, wherein a computer program is stored in the memory 42, and the processor 44 is configured to execute the computer program to perform the method as described in any one or more of the above method embodiments.

Other aspects of the system for estimating a battery pack balance state of a new energy vehicle can be obtained based on description in the previous embodiments, and thus will not be repeated herein.

In accordance with another aspect of the present disclosure, a non-transitory computer readable storage medium is provided. The non-transitory computer readable storage medium stores a computer program, wherein the computer program, when being executed by a processor, causes the processor to perform the method as described in any one or more of the above embodiments.

Other aspects of the system for estimating a battery pack balance state of a new energy vehicle can be obtained based on description in the previous embodiments, and thus will not be repeated herein.

In accordance with still another embodiment of the present disclosure, a detailed method for estimating a battery pack balance state of a new energy vehicle is described.

The method proposed in this embodiment of the present disclosure uses machine learning (ML) models to estimate the expected cell voltage difference value (i.e., $\delta_{ref}$) under different operation conditions, such as vehicle current i, battery pack state of charge SOC, battery temperature T, vehicle speed V, odometer value etc., as shown in Eqn. 1 below.

Then as shown in Eqn. 2, the difference ($\Delta$) between the actual cell voltage difference ($\delta_{act}$) as measured for each individual vehicle and the cell voltage difference reference value ($\delta_{ref}$) as estimated by the model, is referred to as compensated cell voltage difference ($\Delta$) in this embodiment, and it can be defined as a metric to quantify the battery cell balance state for each battery pack in real time.

$$\delta_{ref}=f(i, SOC, T, \ldots) \quad \text{(Eqn. 1)}$$

$$\Delta = \delta_{act} - \delta_{ref} \quad \text{(Eqn. 2)}$$

The above machine learning model shown in Eqn. 1 could be implemented with a linear or nonlinear model function $f$.

(1) Machine Learning Model Implemented with a Linear Function $f$

In one implementation, a linear model function could be defined as shown in Eqn. 3, where $w_0$, $w_1$ and $w_2$ are weights to be trained and optimized.

$$\delta_{ref}=w_0+w_1*i+w_2*SOC \quad \text{(Eqn. 3)}$$

In another implementation, more features (such as temperature, speed, odometer, etc.) as well as their higher order terms may be added to the Eqn. 3 to achieve better model fitting.

(2) Machine Learning Model Implemented with a Nonlinear Function $f$

In one implementation, a nonlinear model, such as neural network (NN) and random forest (RF), may be adopted. Those skilled in the art should understand that other types of nonlinear models may also be adopted in this solution. For example, an NN model with two hidden layers can achieve much better model fitting than the linear model.

The above ML model defines the expected cell voltage reference value ($\delta_{ref}$) under given operating conditions based on the normal fleet performance as training data, where a few obviously abnormal vehicles' data (e.g. the top 1%) can be filtered out during the data cleaning process. Assume most vehicles in the fleet training data perform normally, the expected cell voltage difference reference value output by the ML model would be very close to the average or the median of the normal fleet cell voltage difference under different operating conditions. Then, the compensated cell voltage difference ($\Delta$), as defined in Eqn. 2, can be used as a metric to quantify the battery cell balance state for each battery pack. This compensated cell voltage difference ($\Delta$) can be calculated for each time record and aggregated daily or by each trip-on-battery/charging period basis. Then the high-risk vehicles can be identified when the $\Delta$ is above certain threshold and/or its time series show certain increasing, i.e. degradation, trend.

Figure 5A:
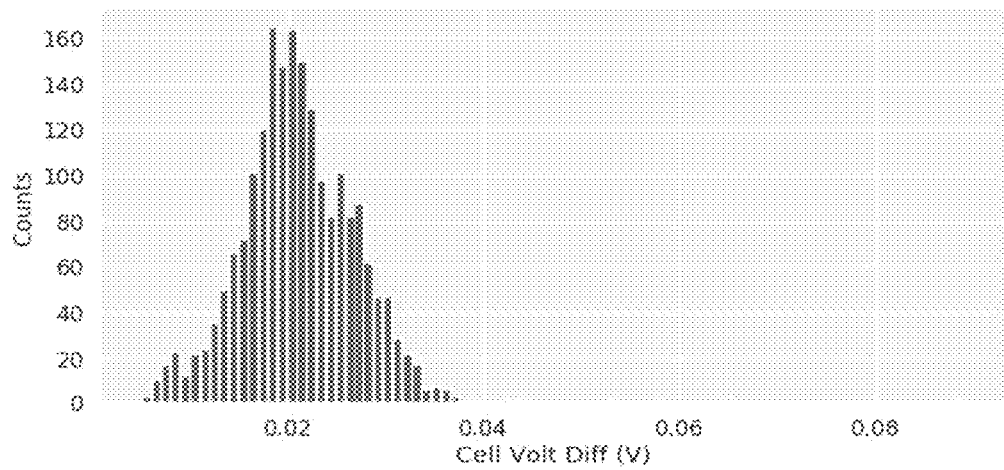
FIG. 5(a) is a schematic diagram showing fleet distribution of the mean cell voltage difference δ (raw data) for each vehicle during charging for one type of EV on one day (std=0.0062)
Figure 5B:
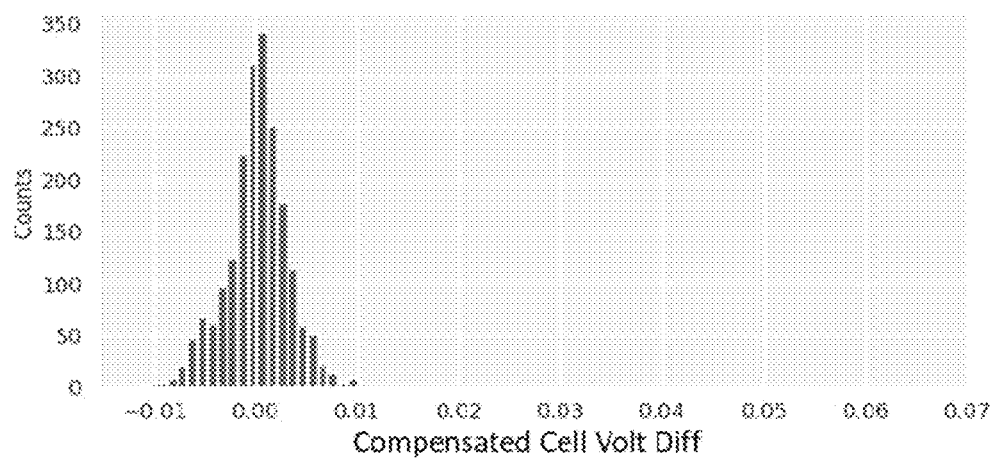
FIG. 5(b) is a schematic diagram showing fleet distribution of the mean compensated cell voltage difference Δ value for each vehicle for the same data above (std=0.0037).

FIG. 5(a) is a schematic diagram showing fleet distribution of the mean cell voltage difference $\delta$ (raw data) for each vehicle during charging for one type of EV on one day (std=0.0062). FIG. 5(b) is a schematic diagram showing fleet distribution of the mean compensated cell voltage difference $\Delta$ value for each vehicle for the same data above (std=0.0037). As shown in FIGS. 5(a) and 5(b), for one type of EV studied, it is observed that the fleet distributions are significantly different for raw cell voltage difference (S) data and the compensated cell voltage difference ($\Delta$) data, where the reference ($\delta_{ref}$) is given by a NN model of two layers trained on samples from one day's data. The latter is much more concentrated and closer to a normal distribution with a much smaller standard deviation, as shown in FIG. 5(b). Therefore, the proposed metric can better describe each vehicle's battery cell balance status in real time, despite different operating conditions.

For each vehicle, its current cell imbalance state can be defined as the normalized weighted average of its recent compensated cell voltage difference $\Delta$ values of a period (e.g. last N days). For example, the weight of last day is 1, and the weights decay exponentially for days earlier than the last day, i.e., $$\Delta = \frac{\sum_{n=1}^{N}(\omega_n \Delta_n)}{\sum_{n=1}^{N}\omega_n} \quad \text{(Eqn. 4)}$$

All the vehicles (that had operated in the last N days) can be ranked by its cell imbalance state evaluated with the above metric. The cell imbalance higher than a certain threshold or showing degradation trend in time series can be defined as high risk vehicles and recommended for immediate attention and predictive maintenance actions at dealerships.

The weights in the linear (e.g. Eqn. 3) and/or nonlinear (e.g. NN) ML models are trained and optimized. So is the decaying scheme for the weights in Eqn. 4. In one implementation, based on training data of normal vehicles, the parameters are chosen so that model fitting errors are minimized.

A product with the proposed solution can be implemented in a cloud-based server or an on-board computing device. It can analyze the time series of relevant data provided by on-board sensors and/or CAN bus, identify all the vehicles with any unhealthy degradation trend, and generate automatic predictive maintenance warning notices for battery packs of various kinds of NEVs (e.g. EV, HEV, PHEV, etc.). It will make sure all the actively running battery packs operate with healthy balanced conditions and detect any battery pack potential imbalance issues or unhealthy degradation trend in the early stage. Once a reasonable alert threshold has been determined for a vehicle model, the "maintenance needed" warnings can be sent to OEMs, dealerships, and customers directly in different formats, so that troubleshooting and predictive maintenance actions can be taken early to extend battery life span, avoid costly warranty loss for OEMs, and highly improve customer satisfaction.

The above is only the exemplary embodiments of the present disclosure; it should be indicated that, on the premise of not departing from the principles of the present disclosure, those of ordinary skill in the art may also make a number of improvements and supplements, and these improvements and supplements should fall within the scope of protection of the present disclosure.

What is claimed is:

1. A method for estimating a battery pack balance state of a new energy vehicle, comprising:
   acquiring an actual cell voltage difference measured for a battery pack of a new energy vehicle, and acquiring one or more operation condition parameters for an operation condition under which the actual cell voltage difference is measured, wherein the actual cell voltage difference is the difference between the maximum and minimum battery cell voltages within the battery pack;
   determining an expected cell voltage difference according to the one or more operation condition parameters;
   determining a compensated cell voltage difference according to the actual cell voltage difference and the expected cell voltage difference; and
   estimating a battery pack balance state of the new energy vehicle according to the compensated cell voltage difference.

2. The method as claimed in claim 1, wherein the one or more operation condition parameters for the operation condition comprise at least one of:
   a vehicle current, a state-of-charge, a battery temperature, a vehicle speed, or an odometer value.

3. The method as claimed in claim 1, wherein determining the expected cell voltage difference according to the one or more operation condition parameters comprises:
   determining, by using a machine learning model, the expected cell voltage difference according to the one or more operation condition parameters.

4. The method as claimed in claim 3, wherein the machine learning model is a linear model, and determining, by using the machine learning model, the expected cell voltage difference according to the one or more operation condition parameters comprises:
   determining the expected cell voltage difference $\delta_{ref}$ based on the following formula:

$$\delta_{ref} = w_0 + w_1 * P_1 + \ldots + w_M * P_M,$$

where $w_0, w_1, \ldots, w_M$ are weights of the linear model, $P_1, \ldots, P_M$ are the one or more operation condition parameters, and M is the number of the one or more operation condition parameters.

5. The method as claimed in claim 4, wherein the weights $w_0, w_1, \ldots, w_M$ of the linear model are obtained through training based on first training data, wherein the first training data comprises one or more operation condition parameters for multiple different operation conditions, and actual cell voltage differences measured for battery packs of multiple new energy vehicles under the multiple different operation conditions.

6. The method as claimed in claim 5, wherein before the weights $w_0, w_1, \ldots, w_M$ of the linear model are obtained through training based on the first training data, actual cell voltage differences measured for battery packs of new energy vehicles satisfying a preset condition are removed from the first training data, wherein the preset condition comprises: new energy vehicles with abnormal fleet performance, new energy vehicles with fleet performance at top or bottom percentiles among the multiple new energy vehicles.

7. The method as claimed in claim 3, wherein the machine learning model is a nonlinear model, and determining, by using the machine learning model, the expected cell voltage difference according to the one or more operation condition parameters comprises:
   determining, based on the nonlinear model by using the one or more operation condition parameters as an input, the expected cell voltage difference $\delta_{ref}$, wherein the nonlinear model comprises a neural network-based model or a random forest-based model.

8. The method as claimed in claim 7, wherein weights in the nonlinear model are obtained through training based on first training data, wherein the first training data comprises one or more operation condition parameters for multiple different operation conditions, and actual cell voltage differences measured for battery packs of multiple new energy vehicles under the multiple different operation conditions.

9. The method as claimed in claim 8, wherein before the weights of the nonlinear model are obtained through training based on the first training data, actual cell voltage differences measured for battery packs of new energy vehicles satisfying a preset condition are removed from the first training data, wherein the preset condition comprises: new energy vehicles with abnormal fleet performance, new energy vehicles with fleet performance at top or bottom percentiles among the multiple new energy vehicles.

10. The method as claimed in claim 1, wherein determining the compensated cell voltage difference according to the actual cell voltage difference and the expected cell voltage difference comprises:
    determining the compensated cell voltage difference $\Delta$ based on the following formula:

$$\Delta = \delta_{act} - \delta_{ref},$$

where $\delta_{act}$ is the actual cell voltage difference, and $\delta_{ref}$ is the expected cell voltage difference.

11. The method as claimed in claim 1, wherein the actual cell voltage difference measured for the battery pack of the new energy vehicle comprises measured actual cell voltage difference for each time record; and
    determining the compensated cell voltage difference according to the actual cell voltage difference and the expected cell voltage difference comprises:
    determining the compensated cell voltage difference for each time record, and aggregating the compensated cell voltage difference for each time record within a preset time unit to obtain mean compensated cell voltage difference;
    or,
    determining the compensated cell voltage difference for each time record, and aggregating the compensated cell voltage difference for each time record by trip-on-battery period basis to obtain mean compensated cell voltage difference;
    or,
    determining the compensated cell voltage difference for each time record, and aggregating the compensated cell voltage difference for each time record by charging period basis to obtain mean compensated cell voltage difference.

12. The method as claimed in claim 11, wherein estimating the battery pack balance state of the new energy vehicle according to the compensated cell voltage difference comprises:
    in a case where the mean compensated cell voltage difference is above a first threshold or mean compensated cell voltage differences in multiple preset time units or multiple trip-on-battery periods or multiple charging periods show a degradation trend, determining that the battery pack of the new energy vehicle is in an unbalanced state.

13. The method as claimed in claim 1, wherein
    before estimating the battery pack balance state of the new energy vehicle according to the compensated cell voltage difference, the method further comprises: determining normalized weighted compensated cell voltage difference within a preset period; and estimating the battery pack balance state of the new energy vehicle according to the compensated cell voltage difference comprises: estimating the battery pack balance state of the new energy vehicle according to the normalized weighted compensated cell voltage difference within the preset period.

14. The method as claimed in claim 13, wherein determining the normalized weighted compensated cell voltage difference within a preset period comprises:

determining normalized weighted compensated cell voltage difference based on the following formula:

$$\Delta_{norm} = \frac{\sum_{n=1}^{N}(\omega_n \Delta_n)}{\sum_{n=1}^{N}\omega_n},$$

where $\Delta_1, \Delta_2, \ldots, \Delta_N$ are respective instances of compensated cell voltage difference within the preset period, $\omega_1, \omega_2, \ldots, \omega_N$ are weights for the respective instances of compensated cell voltage difference within the preset period, and N is the number of the instances of compensated cell voltage difference within the preset period.

15. The method as claimed in claim 14, wherein among the weights $\omega_1, \omega_2, \ldots, \omega_N$ for the respective instances of compensated cell voltage difference within the preset period, a weight for the latest instance of compensated cell voltage difference is equal to a preset value, and weights for earlier instances of compensated cell voltage difference within the preset period decay exponentially.

16. The method as claimed in claim 14, wherein the weights $\omega_1, \omega_2, \ldots, \omega_N$ for the respective instances of compensated cell voltage difference within the preset period are obtained through training based on second training data, wherein the second training data comprises actual vehicle records with abnormal battery pack cell imbalance.

17. The method as claimed in claim 13, wherein estimating the battery pack balance state of the new energy vehicle according to the normalized weighted compensated cell voltage difference within the preset period comprises:

in a case where the normalized weighted compensated cell voltage difference is above a second threshold or normalized weighted compensated cell voltage differences in multiple preset periods show a degradation trend, determining that the battery pack of the new energy vehicle is in an unbalanced state.

18. The method as claimed in claim 1, further comprising:

sending a maintenance required warning when a result of estimating the battery pack balance state of the new energy vehicle according to the compensated cell voltage difference indicates that the battery pack of the new energy vehicle is in an unbalanced state.

19. A system for estimating a battery pack balance state of a new energy vehicle, located in a server or an on-board computing device, the system comprising a memory and a processor, wherein a computer program is stored in the memory, and the processor is configured to execute the computer program to perform the method as claimed in claim 1.

20. A non-transitory computer readable storage medium, in which a computer program is stored, wherein the computer program, when being executed by a processor, causes the processor to perform the method as claimed in claim 1.

* * * * *